(12) United States Patent
Charles et al.

(10) Patent No.: US 7,327,039 B2
(45) Date of Patent: Feb. 5, 2008

(54) NANOPARTICLE FILLED UNDERFILL

(75) Inventors: Scott B. Charles, Hudson, WI (US); Kathleen M. Gross, Woodbury, MN (US); Steven C. Hackett, Oakdale, MN (US); Michael A. Kropp, Cottage Grove, MN (US); William J. Schultz, North Oaks, MN (US); Wendy L. Thompson, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/441,879

(22) Filed: May 20, 2003

(65) Prior Publication Data
US 2003/0218258 A1 Nov. 27, 2003

Related U.S. Application Data

(60) Provisional application No. 60/383,379, filed on May 23, 2002.

(51) Int. Cl.
- *H01L 23/48* (2006.01)
- *H01L 23/52* (2006.01)
- *H01L 29/40* (2006.01)
- *H01L 21/44* (2006.01)
- *H01L 21/48* (2006.01)
- *H01L 21/50* (2006.01)

(52) U.S. Cl. .............. 257/778; 257/789; 257/795; 257/786; 257/E23.015; 257/E23.04

(58) Field of Classification Search ........... 257/778, 257/779, 787, 788, 789, 790, 791–793, 795, 257/782, 783, 786, E23.015, E23.02, E23.023, 257/E23.169, E23.04
See application file for complete search history.

(56) References Cited

U.S. PATENT DOCUMENTS

| 2,801,185 A | 7/1957 | Iler |
| 3,699,294 A | 10/1972 | Sudduth |
| 4,421,958 A | 12/1983 | Kameda |
| 4,522,958 A | 6/1985 | Das et al. |

(Continued)

FOREIGN PATENT DOCUMENTS

EP  0 439 171 A2  7/1991

(Continued)

OTHER PUBLICATIONS

"Fast-Flow Underfill Encapsulant: Flow Rate and Coefficient of Thermal Expansion", Wong et al., IEEE Transactions on Components Packaging and Manufacturing Technology—Part A, vol. 21, No. 2, Jun. 1998.

(Continued)

*Primary Examiner*—Hoai V Pham
*Assistant Examiner*—DiLinh Nguyen
(74) *Attorney, Agent, or Firm*—Scott A. Bardell; James A. Baker

(57) ABSTRACT

The invention provides electronic articles and methods of making said articles. The electronic articles comprise an electronic component bonded and electrically connected to a substrate using an underfill adhesive comprising the reaction product of a thermosetting resin, curing catalyst, and surface-treated nanoparticles that are substantially spherical, non-agglomerated, amorphous, and solid.

17 Claims, 1 Drawing Sheet

U.S. PATENT DOCUMENTS

| | | | |
|---|---|---|---|
| 4,575,580 A | | 3/1986 | Jandrell |
| 4,749,120 A | | 6/1988 | Hatada |
| 4,999,699 A | * | 3/1991 | Christie et al. ............. 257/778 |
| 5,094,769 A | * | 3/1992 | Anderson, Jr. et al. ....... 252/71 |
| 5,162,437 A | * | 11/1992 | Hayashi et al. ............. 525/109 |
| 5,243,162 A | | 9/1993 | Kobayashi |
| 5,371,327 A | | 12/1994 | Fujinami et al. |
| 5,405,688 A | * | 4/1995 | Decker et al. ........... 428/297.4 |
| 5,648,407 A | | 7/1997 | Goetz et al. |
| 5,855,821 A | | 1/1999 | Chau et al. |
| 5,863,970 A | | 1/1999 | Ghoshal et al. |
| 5,910,522 A | | 6/1999 | Schmidt et al. |
| 5,935,314 A | | 8/1999 | Higuchi et al. |
| 6,020,395 A | * | 2/2000 | Angeletakis |
| 6,049,038 A | | 4/2000 | Suzuki |
| 6,054,222 A | | 4/2000 | Takami et al. |
| 6,057,381 A | | 5/2000 | Ma et al. |
| 6,073,497 A | | 6/2000 | Jiang et al. |
| 6,114,645 A | | 9/2000 | Burgess |
| 6,180,696 B1 | | 1/2001 | Wong et al. |
| 6,194,788 B1 | | 2/2001 | Gilleo et al. |
| 6,209,196 B1 | | 4/2001 | Ozono et al. |
| 2002/0022709 A1 | | 2/2002 | Mader |
| 2002/0045709 A1 | | 4/2002 | Sumita et al. |
| 2003/0080437 A1 | * | 5/2003 | Gonzalez et al. |
| 2003/0111519 A1 | | 6/2003 | Kinney et al. |
| 2003/0131937 A1 | * | 7/2003 | Konarski |

FOREIGN PATENT DOCUMENTS

| | | |
|---|---|---|
| EP | 0 446 666 A2 | 9/1991 |
| EP | 0 933 809 A2 | 8/1999 |
| GB | 2 049 290 A | 12/1980 |
| GB | 2 233 499 A | 1/1991 |
| JP | 62-39641 | 2/1987 |
| JP | 1-263131 | 10/1989 |
| JP | 5-143219 | 6/1993 |
| JP | 7-219697 | 8/1995 |
| JP | 11-106480 | 4/1999 |
| JP | 2000-336247 | 12/2000 |
| JP | 2001-39709 | 2/2001 |
| JP | 2001-55486 | 2/2001 |
| WO | WO 00/34032 A1 | 6/2000 |

OTHER PUBLICATIONS

"High Performance Filled No-Flow Underfill for Flip Chip Applications", Zhang et al., APACK 2001 Conference on Advances in Packaging, Singapore, ISBN No. 981-04-4638-1.

"Incorporation of Inorganic Filler into the No-Flow Underfill Material for Flip-Chip Application", Fan et al., 2000 International Symposium on Advanced Packaging Materials, pp. 303-310.

"Controlled Growth of Monodisperse Silica Spheres in the Micron Size Range", Stober et al., Journal of Colloid and Interface Science 26, pp. 62-69 (1968).

"Nanocomposite Underfills for Flip-Chip Application", Gross et al., 53$^{rd}$ Electronic Components and Technology Conference 2003, Submitted Feb. 20, 2003/Presented May 29, 2003.

"New Developments in Single Pass Reflow Encapsulant for Flip Chip Application", Liu et al., 2001 International Symposium on Advanced Packaging Materials, pp. 74-79.

"New Materials for High Performance No-Flow Underfill", Gross et al., 2002 International Symposium on Microelectronics, Submitted May 28, 2002/Presented Sep. 5, 2002.

"Recent Advances in the Development of No-Flow Underfill Encapsulants—A Practical Approach towards the Actual Manufacturing Application", Shi et al., 1999 Electronic Components and Technology Conference, pp. 770-776.

"Study of Reliability and Process Ability for Preset Underfill Sheet Material As Future Standard Flip Chip Packaging Process", Noro et al., 2000 Electronic Components and Technology Conference, pp. 319-322.

* cited by examiner

NANOPARTICLE FILLED UNDERFILL

CROSS REFERENCE TO RELATED APPLICATION

This application claims priority to U.S. Provisional Patent Application No. 60/383,379, filed on May 23, 2002.

BACKGROUND

The invention relates to curable filled underfill bonding compositions. In the electronics industry, electronic components such as resistors, capacitors, inductors, transistors, integrated circuits, chip carriers, and the like are typically mounted on substrates or circuit boards in one of two ways. In the first way, the components are mounted on one side of the board and leads from the components extend through holes in the board. Solder is applied to the opposite side of the board to anchor the leads and provide an electrical connection. In the second way, the components are soldered to the same sides of the board upon which they are mounted. These latter devices are said to be "surface mounted".

Surface mounting of electronic components is a desirable technique in that it may be used to make very small circuit structures and that it can easily be used in automated processes. One family of surface-mounted devices comprises integrated electronic components having numerous connecting leads attached to pads located on the surface of a substrate. Either the electronic component or the substrate to which it is attached is provided with small bumps or balls of solder positioned in locations that correspond to the bonding pads on the electronic component or the substrate. The electronic component is electrically mounted to the substrate by placing it in contact with the substrate such that solder bumps contact the corresponding pads on the substrate and the component. The assembly is heated to a point at which the solder melts or reflows and then the assembly is cooled so to bond the electronic component to the substrate through the solidified solder.

One problem with this technology is that the electronic component, the solder, and the substrate often have significantly different coefficients of thermal expansion. As a result, differing expansion rates as the assembly heats during use can cause severe stresses, for example, thermomechanical fatigue at the connections and lead to failures that impact the reliability of the device.

Thermoset epoxy resins have been used to minimize the effects of different thermal expansions. Polyepoxides have been used as an underfill that surrounds the periphery of the electronic component and occupies the space between the electronic component and the substrate that is not occupied by solder. Improved underfill materials have been formulated by incorporating conventional silica filler, that is, silica having a particle size of one micrometer to 50 micrometers or greater into the underfill composition. Although high loading levels of such silica filler may provide desirable coefficients of thermal expansion, such levels also may provide undesirable viscosities inhibiting the flow of the underfill bonding composition. Such particles may also get trapped around small features and in between small gaps when used to underfill electronic assemblies and may interfere with the electrical connection between the solder bumps and the bonding pads if the underfill bonding composition is placed between the component and substrate before the solder is reflowed. These larger filler particles also have a tendency to settle in underfill formulations. Settling of the filler particles prior to cure can result in an underfill having a non-uniform coefficient of thermal expansion. Settling of particles shortens shelf life and can also cause dispensing problems should this settling occur in the packaged underfill bonding composition.

SUMMARY

The invention provides electronic assemblies and methods of making electronic assemblies that utilize curable bonding compositions that comprise a curable resin and surface-modified nanoparticles. The use of surface-modified nanoparticles provides curable underfill bonding compositions which may be cured to provide an underfill adhesive having a desirable coefficient of thermal expansion (CTE) without interfering with the soldering process in a no-flow underfill process and providing useful viscosity ranges for use in capillary underfill processes. "Useful viscosity ranges" means viscosities that allow for the curable bonding composition to be displaced by a descending electronic component during first die placement and then solder reflow or to flow or be wicked underneath the electronic component and between an electronic component and a substrate that are soldered together.

In one aspect, the invention provides an electronic component electrically bonded to a substrate with an underfill adhesive between the electronic component and substrate, wherein the underfill adhesive comprises the reaction product of a curable mixture comprising polyepoxide resin, curing catalyst, and surface-treated nanoparticles that are substantially spherical, non-agglomerated, amorphous, and solid.

In another aspect, the invention provides a method of making an electronic assembly comprising the steps of providing an electronic component having solder bumps or bonding pads thereon; providing a substrate having electrical bonding pads or solder bumps thereon; providing a curable bonding composition comprising a curable mixture of polyepoxide resin, curing catalyst, fluxing agent, and surface-treated nanoparticles that are substantially spherical, non-agglomerated, amorphous, and solid; positioning the curable composition between the electronic component and the substrate such that the solder bumps align with the electrical bonding pads to form an assembly; and applying heat to the assembly to cure the bonding composition and form the electrical connection.

Preferably, the curable bonding compositions are essentially volatile-free, i.e., essentially free of volatile materials released or formed during the cure of the compositions. The term "curable", as used herein, means chemically or physically crosslinkable to form a glassy, insoluble, non-flowable network which is maintained under normal use conditions. An "underfill adhesive" is the reaction product of a curable bonding composition after cure. "Non-agglomerated" nanoparticles means substantially unitary, single particles, as compared to agglomerated particles, for example, fumed silica.

The no-flow processes of the invention do not require: 1) other than gravity, additional force applied to the electronic component in order to provide electrical contact between the solder bumps and the corresponding electrical contact bonding pads; 2) additional heat for viscosity adjustment beyond the amount required to cure the bonding composition and reflow the solder; 3) that the solder bumps have a specific or irregular shape in order to provide an electrical connection during solder reflow; and 4) that the underfill bonding composition be dispensed in more than one layer, wherein not all of the layers are filled.

DETAILED DESCRIPTION

Figure 1:
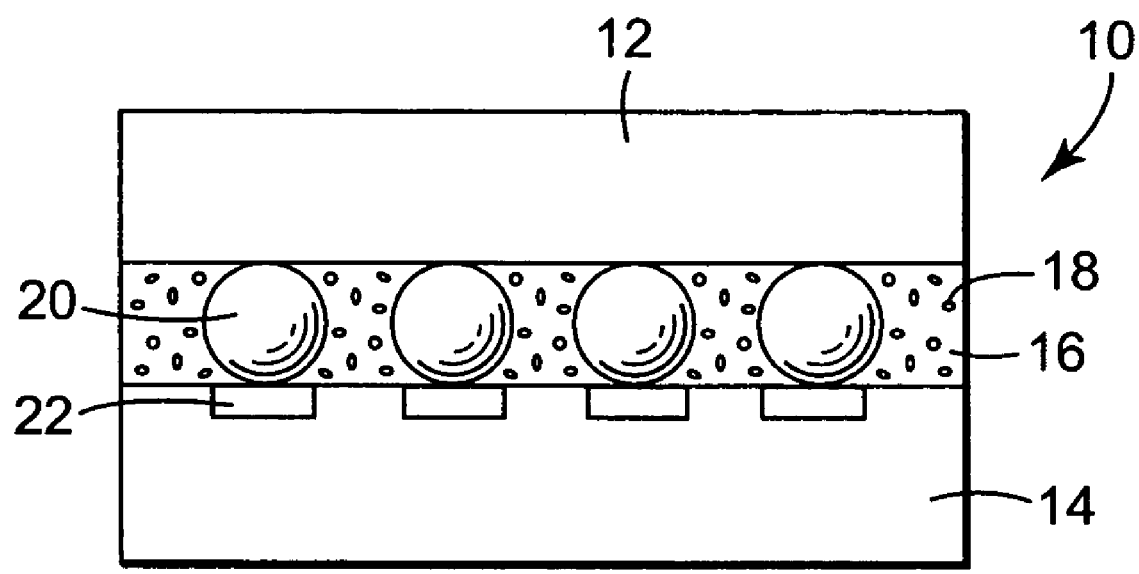
FIG. 1 is a schematic cross-section of an embodiment of an electrical assembly of the invention.

In one embodiment, the present invention provides an electrical assembly that comprises an electronic component electrically bonded to a substrate with an underfill adhesive. The underfill adhesive is the reaction product of a curable bonding composition that comprises a resin, curing catalyst, and surface-treated nanoparticles. The surface-treated nanoparticles are amorphous, substantially spherical, non-agglomerated, and substantially inorganic. The curable bonding composition may also contain a flux or fluxing agent.

Now referring to FIG. 1, an electrical assembly 10 comprises an electronic component 12 bonded to a substrate 14 by means of an underfill adhesive 16 containing surface-treated nanoparticles 18. In this embodiment, the electronic component 12 is electrically bonded to the substrate through contact of the solder bumps 20 with bonding pads 22.

Electronic component 12 is not specifically limited and may be any electronic component having solder bumps or bonding pads thereon or capable of having solder bumps. Specific examples of electronic components include, but are not limited to, integrated circuit chips, resistors, capacitors, and the like. Useful substrates are those substrates having electrical bonding pads or solder bumps or those substrates capable of having electrical bonding pads. The type of substrate is not specifically limited and includes for example, printed circuit boards and flexible circuits. In this invention, the electrical assembly can also be a package bonded to a substrate. In a package, the chip is placed on a thin, small circuit board and encapsulated. Solder balls are placed on the bottom of the board allowing connection to a substrate.

The curable bonding compositions of the invention contain one or more polyepoxide resins. Useful polyepoxide resins include, for example, substituted or unsubstituted aliphatic, cycloaliphatic, aromatic and/or heterocyclic polyepoxides, such as glycidyl esters, glycidyl ethers, glycidyl-functional amino phenols, glycidyl amines, or epoxidized olefins, and combinations thereof.

Specific examples of polyepoxide resins useful in the compositions of the present invention include, but are not limited to, diglycidyl ethers of bisphenol A and diglycidyl ethers of bisphenol F, aliphatic monoglycidyl ethers, aliphatic diglycidyl ethers, aliphatic multifunctional glycidyl ethers, and aliphatic glycidyl esters.

Examples of useful polyepoxide resins that are diglycidyl ethers of bisphenol A include, but are not limited to, EPON™ Resins 825, 826, 828, and 1462, available from Resolution Performance Productions, Houston, Tex.; D.E.R.™ 330, 331, and 332, available from Dow Chemical Company, Midland, Mich.; and ARALDITE™ GY 6008, GY 6010, and GY 2600, available from Vantico, Brewster, N.Y.

Examples of useful polyepoxide resins that are diglycidyl ethers of bisphenol F include, but are not limited to, EPON™ Resin 862, available from Resolution Performance Productions, Houston, Tex.; and ARALDITE™ GY 281, GY 282, GY 285, PY 306, and PY 307, available from Vantico, Brewster, N.Y.

Examples of useful mono, di, and multifunctional glycidyl ether resins include, but are not limited to, XB 4122, MY 0510, TACTIX™ 556 and TACTIX™ 742, available from Vantico, Brewster, N.Y.; and EPON™ 1510, HELOXY™ Modifier 107, HELOXY™ Modifier 48, available from Resolution Performance Productions, Houston, Tex.

The polyepoxide resins are preferably ionically clean in that they are substantially free of ionic species. The polyepoxide resins are also preferably substantially free of hydroxyl functionality. Removal of residual ionic halogens can be accomplished by first reacting the polyepoxide resin with a base. The base is present in an amount which exceeds the molar equivalent based on the materials comprising hydrolyzable halide. This amount depends on the starting polyepoxide resin. For example, if no other acids are present, a theoretical amount of base can be used based on the ppm of hydrolyzable halide. In other situations, for example, 100 percent to 200 percent base is required. The polyepoxide resin may be combined with a base at room temperature to form a mixture or in other situations, the polyepoxide resin may be pre-heated. Thus, the heating and agitation step may occur prior to and during the reaction with the base, simultaneously with the base treatment step, or after the base is added to the epoxy resin. This order is dictated by the starting polyepoxide resin.

The selection of the base depends upon the starting polyepoxide resin. Examples of suitable bases useful in the process of the present invention include, but are not limited to, hydroxides such as potassium hydroxide in water, sodium hydroxide, and lithium hydroxide, hydrides such as lithium hydride, sodium hydride (optionally in mineral oil), and potassium hydride, alkoxides such as primary, secondary, and tertiary (e.g., potassium t-butoxide in tetrahydrofuran (THF)) alkoxides such as sodium ethoxide, carbonates such as potassium carbonate and sodium carbonate, and quaternary ammonium salts.

Generally, the base strength and the temperature are such that the halohydrin closes to the polyepoxide and under which the polyepoxide does not polymerize. For example, in one case for an epichlorohydrin-derived polyepoxide resin, potassium t-butoxide in THF was suitable at 25° C., but the resin polymerized at 70° C.

The use of non-nucleophilic bases such as sodium hydride are believed to have the advantageous effect of closing the halohydrin without reacting appreciably with other base (hydrolytically) sensitive functionality such as esters.

If a non-nucleophilic base is used, the process preferably comprises the following steps: (a) distilling a polyepoxide resin comprising materials containing hydrolyzable halide using molecular distillation to yield a polyepoxide resin distillate; and (b) reacting said polyepoxide resin distillate with a base wherein said base is present in a quantity which exceeds the molar equivalent based on the materials containing hydrolyzable halide.

The initial distillation step removes moisture along with high molecular weight materials containing hydroxyl functionality. The product can either be neutralized with water and carbon dioxide to remove residual sodium hydride before distillation or can be distilled directly without neutralization.

The mixture is heated to a temperature suitable for reaction of the halohydrin to form the polyepoxide resin while agitated. For example, the mixture may be heated using a heat mantel. Generally, the mixture is heated between 20° C. to 200° C. for 1 minute to 12 hours. However, the temperature and time depend upon the starting polyepoxide resin, base strength and solubility, the catalytic activity of the base towards polyepoxide resin polymerization, and commercial viability.

This heating and mixing can occur after the polyepoxide resin and base are combined, prior to and during the base treatment step, or simultaneously with the addition of the base and base treatment step.

The mixture is usually heated to alter the viscosity which in turn helps the dispersion of the base.

The heated mixture is then neutralized, if required, using carbon dioxide to form a crude product. With the hydrides, this neutralization step may not be required. Optionally, at this point, residual salts may be removed from the crude product by filtration.

Next, the crude product is isolated by molecular distillation to yield the product. For example, a rolled film evaporator or wipe film evaporator may be used. With a rolled film evaporator, the crude product is distributed across a vertical heated surface by an efficient, self-cleaning roller wiper system into a uniform thin film. The evaporated material travels a short distance to an internal condenser. A smaller vacuum is used with low operating temperatures. (See UIC Inc., *Short Path Vacuum Distillation from Laboratory to Production*, 1997). With a wipe film evaporator, a wiper is used instead of the self-cleaning roller wiper.

The distillation conditions depend on the boiling point of the crude product.

Noncondensible materials which may be present in the starting materials, that is, the polyepoxide resin, are removed during molecular distillation.

The yielded polyepoxide resin has low levels of hydrolyzable halide, that is, from 1 to 100 ppm, preferably less than 10 ppm, more preferably less than 1 ppm.

The yielded product is preferably free of high molecular weight materials. High molecular weight material-free is defined herein as having no dimers and materials having higher molecular weight than the dimer. The epoxide equivalent weight is at or near the theoretical epoxide equivalent weight (that is, within 2 percent, preferably within 1 percent of the theoretical epoxide equivalent weight) and liquid chromatography of the distillate indicates greater than 98 percent monomeric polyepoxide resin. These data indicate a polyepoxide resin that is substantially free of hydroxyl functionality.

The purified polyepoxide resin has a higher cured glass transition temperature than the less pure version, which is advantageous. The purified polyepoxide resin is also more predictable due to product consistency. The viscosity is lower than the less pure version of the same polyepoxide resin. There is no residual base in the polyepoxide product, which is advantageous. Residual base may inhibit cationically cured polyepoxides. Other low hydrolyzable halide polyepoxide resins such as EPON™ Resin 1462, available from Resolution Performance Products, Houston, Tex., which have some residual base are described as having a yellow color (a Gardner Color Scale value of less than 3). The purified polyepoxide product is colorless. For example, using the Gardner Test (ASTM D1544-80), the Gardner Color Scale value is less than 0.1 for purified EPON™ Resin 828.

The above polyepoxide resin purification process can be batch or continuous.

A preferred method of making ionically clean polyepoxide resins is described in U.S. Pat. Application Publication No. US 2002-0022709 A1 (Mader et al), entitled "Process for the Elimination of Materials Containing Hydrolyzable Halides and Other High Molecular Weight Materials from Epihalohydrin Derived Epoxy Resins", incorporated by reference herein.

Polyepoxide resin is present in the curable bonding compositions of the invention at a level of from about 10 to 70, preferably from about 20 to about 60, and more preferably from about 30 to about 50 parts per hundred parts of the bonding composition, (and any whole or fraction amount in between 10 and 70 parts), that is, polyepoxide resin, curing catalyst, optional fluxing agent, and nanoparticles.

The curable bonding compositions of the present invention optionally, but preferably, contain one or more catalysts when a thermosetting resin is present. The function of the curing catalysts in the compositions of the invention is to accelerate curing of the thermosetting resin. Useful curing catalysts are those that promote epoxide homopolymerization as well as coreaction of the fluxing agent with the polyepoxide resin. Additionally, useful curing catalysts are latent under ambient conditions but are activated to accelerate reactions when heated above a temperature of 80° C. or greater. Classes of useful curing catalysts include substituted imidazoles, metal acetylacetonates, metal acetates, metal halides, metal imidazole complexes, and metal amine complexes. Metals useful in the previously mentioned classes of curing catalysts include $Sc^{3+}$, $Cu^{2+}$, $Mo^{2+}$, $Ru^{3+}$, $Rh^{3+}$, $Cd^{2+}$, $La^{3+}$, $Hf^{4+}$, $In^{3+}$, $Tl^{1+}$, $Tl^{3+}$, $Pb^{2+}$, $Pb^{3+}$, $Ti^{4+}$, $Ce^{3+}$, $Ce^{4+}$, $Pr^{3+}$, $Eu^{3+}$, $Gd^{3+}$, $Tb^{3+}$, $Dy^{3+}$, $Ho^{3+}$, $Er^{3+}$, $Tm^{3+}$, $Lu^{3+}$, $Th^{3+}$, $Co^{2+}$, $Co^{3+}$, $Fe^{2+}$, $Fe^{3+}$, $Ni^{2+}$, $Pd^{2+}$, $Pt^{2+}$, $Ga^{3+}$, $Y^{3+}$, $V^{3+}$, $Sm^{3+}$, $Nd^{3+}$, $Cr^{3+}$, $Li^{1+}$, $Be^{2+}$, $K^{1+}$, $Ca^{2+}$, $Na^{1+}$, $Ba^{2+}$, $Sr^{2+}$, $Zn^{2+}$, $Mg^{2+}$, or $Ag^{1+}$. Typical curing catalysts include metal imidazole complexes, such as zinc imidazolate and copper imidazolate, for example, as well as substituted imidazoles, such as 4,5-diphenylimidazole, for example. Curing catalysts are present in the compositions of the invention at a level of 0.02 to 10 weight percent, 0.05 to 5 weight percent, or 0.25 to 2 weight percent, for example.

Nanoparticles suitable for use in the compositions of the invention are substantially spherical in shape, and have an average particle diameter in the range of from about 1 nanometer to less than 1 micrometer, and are substantially inorganic in chemical composition. The nanoparticles can comprise essentially a single oxide such as silica or can comprise a core of an oxide of one type (or a core of a material other than a metal oxide) on which is deposited an oxide of another type. Generally, the nanoparticles can range in size (mean particle diameter) from about 5 nanometers to about 500 nanometers, from about 10 nanometers to about 300 nanometers, or from about 10 nanometers to about 100 nanometers, and can range in size in any range between 5 and 500 nanometers. It is also desirable that the nanoparticles have a relatively narrow particle size distribution around a given mean particle size.

It is also desirable that the nanoparticles remain substantially non-aggregated, as nanoparticle aggregation can result in precipitation, gellation, or a dramatic increase in sol viscosity. Thus, a particularly desirable class of nanoparticles for use in preparing the compositions of the invention includes sols of inorganic nanoparticles (e.g., dispersions of inorganic nanoparticles in liquid media), especially sols of amorphous silica. Such sols can be prepared by a variety of techniques and in a variety of forms that include hydrosols (where water serves as the liquid medium), organosols (where organic liquids are used), and mixed sols (where the liquid medium comprises both water and an organic liquid). See, e.g., the descriptions of the techniques and forms given in U.S. Pat. No. 2,801,185 (Iler) and U.S. Pat. No. 4,522,958 (Das et al.), which descriptions are incorporated herein by reference; as well as those given by R. K. Iler in *The Chemistry of Silica*, John Wiley & Sons, NY (1979).

Due to their surface chemistry and commercial availability, silica hydrosols are preferred for use in preparing the compositions of the invention. Such hydrosols are available in a variety of particle sizes and concentrations from, e.g., Nyacol Products, Inc. in Ashland, Md.; Nalco Chemical Company in Oakbrook, Ill.; and E. I. duPont de Nemours and Company in Wilmington, Del. Concentrations of from about 10 to about 50 percent by weight of silica in water are generally useful, with concentrations of from about 30 to about 50 weight percent being preferred (as there is less water to be removed). If desired, silica hydrosols can be prepared, e.g., by partially neutralizing an aqueous solution of an alkali metal silicate with acid to a pH of about 8 or 9 (such that the resulting sodium content of the solution is less than about 1 percent by weight based on sodium oxide). Other methods of preparing silica hydrosols, e.g., electrodialysis, ion exchange of sodium silicate, hydrolysis of silicon compounds, and dissolution of elemental silicon are described by Iler, supra.

Preparation of the curable resin compositions generally requires that at least a portion of the surface of the inorganic nanoparticles be modified so as to aid in the dispersibility of the nanoparticles in the polyepoxide resin. This surface modification can be effected by various different methods which are known in the art. (See, e.g., the surface modification techniques described in U.S. Pat. No. 2,801,185 (Iler); U.S. Pat. No. 4,522,958 (Das et al.); and U.S. Pat. No. 5,648,407 (Goetz et al.), which descriptions are incorporated herein by reference.)

For example, silica nanoparticles can be treated with organosilanes, e.g., alkyl chlorosilanes, trialkoxy arylsilanes, or trialkoxy alkylsilanes, or with other chemical compounds, e.g., organotitanates, which are capable of attaching to the surface of the particles by a chemical bond (covalent or ionic) or by a strong physical bond, and which are chemically compatible with the chosen polyepoxide resin(s). Treatment with organosilanes is generally preferred. When aromatic ring-containing polyepoxide resins are utilized, surface treatment agents which also contain at least one aromatic ring are generally compatible with the polyepoxide resin and are thus preferred.

In preparing the curable bonding compositions, a hydrosol (e.g., a silica hydrosol) can generally be combined with a water-miscible organic liquid (e.g., an alcohol, ether, amide, ketone, or nitrile) and, optionally (if alcohol is used as the organic liquid), a surface treatment agent such as an organosilane or organotitanate. The surface treatment agent should be used in an amount sufficient to provide an organic coating on the particle surface that will allow the particle to be dispersed in an organic resin. If an alcohol is used as the water miscible solvent added to the sol, the alcohol may act as the surface modification agent. Organosilanes or organotitanates are the preferred surface modification agent. The organosilane or organotitanate can be directly added silica hydrosol/organic solvent mixture. Heating is generally needed to drive the reaction of the surface modification agent onto the surface of the metal oxide particle. The reaction of surface modification agents onto the nanoparticle surface can be catalyzed by acids, bases or ions such as fluoride or chloride ion.

The amount of surface modification agent used is somewhat dependant on the surface area of the particle. Smaller particles have a higher surface area to volume ratio, thus the smaller particle will require a greater amount of surface modification agent than a larger particle. The total amount of organic surface modification agent on a particle may be as high as 40 percent by weight for a very small particle, i.e., 5 nanometers, or as little as 3 percent by weight for larger particles.

The particle can be modified with an alcohol by reaction of the alcohol with the particle surface. This process can be done by mixing the hydrosol with a high boiling alcohol and removing the water by distillation. As the water is removed, the alcohol reacts with the nanoparticle surface providing a covalently attached coating that will allow the particle to be dispersed in organic resins. Either process provides an organosol comprising nanoparticles which have surface-attached or surface-bonded organic groups (that is, "substantially inorganic" nanoparticles).

The resulting organosol can then be combined with a curable resin composition and the organic liquid removed by, e.g., using a rotary evaporator. Preferably, the organic liquid is removed by heating under vacuum to a temperature sufficient to remove even tightly-bound volatile components. Stripping times and temperatures can generally be selected so as to maximize removal of volatiles while minimizing advancement of the curable resin composition.

Failure to adequately remove volatiles at this stage leads to void formation during the curing of the composition, resulting in deterioration of thermomechanical properties in the underfill adhesive. This is a particularly severe problem in electronic underfill adhesives. The volatile components may result in void formation during the curing and bonding process and have a disastrous effect on the reliability of the electronic assembly. Unremoved volatiles can also plasticize the cured resin network and thereby degrade its high temperature properties. Generally, resin sols having volatile levels less than about 2 weight percent (preferably, less than about 1.5 weight percent) provide void-free underfill adhesives having the desired thermomechanical properties.

Removal of volatiles can result in gel formation (due to loss of any surface-bound volatiles), if the above-described surface treatment agent is not properly chosen so as to be compatible with the curable resin, if the agent is not tightly-bound to the nanoparticle surface, and/or if an incorrect amount of agent is used. As to compatibility, the treated particle and the resin should generally have a positive enthalpy of mixing to ensure the formation of a stable sol. (Solubility parameters can often be conveniently used to accomplish this by matching the solubility parameter of the surface treatment agent with that of the curable resin.) Removal of the volatiles provides curable resin compositions, which can generally contain from about 18 to about 54 volume percent (preferably, from about 24 to about 50 volume percent) substantially inorganic nanoparticles, and any whole or fractional amount or range between 18 and 54 volume percent.

An alternative process to disperse the surface treated nanoparticles in curable resins is to first dry the particles from the solvent/water solution after attaching the surface modification agent. This can be accomplished by applying heat, and in some cases vacuum, and allowing the solvent and water to evaporate. The dry powder can then be dispersed into the organic resin by means of a high-shear mixing device. Following the dispersion of the nanoparticles into the organic resin, it may be desirable to apply heat and vacuum to remove any trace of volatile components that may remain.

The selection of the type of surface modification agent is dependant on the type of organic resin the particle will be dispersed into. The surface modification must provide an organic surface attached coating that is compatible with the organic resin used in the composition. For example, when dispersing particles in an aromatic epoxy resin, a surface modification agent containing aromatic groups may be preferred. If an aliphatic acrylic resin is being used, a surface modification agent containing aliphatic groups may be preferred.

The surface modification may also provide a site to covalently bond the nanoparticle to the curable resin during the curing process. For example, if an acrylic resin is being used, particles having acrylic reactive groups may be desirable.

The amount of surface-treated nanoparticles in the curable bonding compositions of the invention is typically between about 30 percent and 70 percent, more typically between about 35 percent and 65 percent by weight of the total composition, and may be any whole or fractional amount or any range in between 30 and 70 weight percent.

Additionally, fluxing materials may be added to the curable bonding composition to impart fluxing ability to the composition. Any fluxing agent can be added that does not materially adversely interfere with the adhesion or cause premature curing of the composition. Useful fluxing agents include acids such as, for example, carboxylic acids, acid anhydrides, and chelating fluxing agents, for example. Useful chelating fluxing agents include, for example, those having both an aromatic hydroxyl oxygen atom and an imino group which are separated by two atoms (e.g., two carbon atoms) from each other (i.e., located on an atom beta to each other). The beta atom refers to those atoms located in a position beta to either the carbon or the nitrogen atoms of the imino group, or both. Examples of useful chelate fluxing agents include Schiff base type compounds such as 2,2'-[1,4-phenylene-bis(nitrilomethylidyne)]bisphenol, 2,2'-[1,3-phenylene-bis(nitrilomethylidyne)]bisphenol, 2,2'-[1,2-phenylene-bis(nitrilomethylidyne)]bisphenol, 2,2'-[1,3-propane-bis(nitrilomethylidyne)]bisphenol, 2,2'-[1,2-ethane-bis(nitrilomethylidyne)]bisphenol, 2,2'-[1,2-propane-bis(nitrilomethylidyne)]-bisphenol, 2,2'-[1,2-cyclohexylbis(nitrilomethylidyne)]bisphenol, and 2-[[(2-hydroxyphenyl)imino]methyl]phenol.

The curable underfill bonding compositions are generally made by combining the organosol described above with a thermosetting resin, and then removing the volatiles. The fluxing agent, catalyst, and other additives can then be added.

In a no-flow underfill process, the viscosity of the curable bonding composition must be low enough during solder reflow to be squeezed out as the electronic component descends onto the substrate so that the solder ball can contact the bonding pad.

In a capillary underfill process, the viscosity of the curable bonding composition must be low enough for it to be able to wick between the electronic component and the substrate. Generally, elevated temperatures are used during the wicking process. Room temperature viscosities of less than 200 poise, generally less than 100 poise, are desired. The viscosity of the curable underfill bonding composition can be adjusted by the selection of low viscosity resins and by the loading level of, and size of, nanoparticles.

It is desirable for the coefficient of thermal expansion (CTE) of the underfill to be close to the CTE of solder, preferably in the range of 20 to 50 ppm/° C., desirably in the range from about 25 to 45 ppm/° C. or any whole or fractional amount between 20 and 50 ppm/° C. While it is desirable to have a CTE as close to 20 ppm/° C. as possible, the viscosity typically becomes unmanageable as the filler level increases.

Methods of Bonding the Electronic Assembly

In another embodiment, the invention provides a method of making an electronic assembly comprising the steps of providing an electronic component having contact or electrical pads; providing a substrate having contact or electrical bonding pads with either the electronic component or the substrate having solder bumps; providing a curable bonding composition of the invention between the electronic component and the substrate such that the solder bumps align with the electrical bonding pads to form an assembly and applying an effective amount of heat to the assembly to cure the resin and form the electrical connection. The curable bonding compositions of the invention may be used in either a no flow or capillary underfill process to bond electronic components.

In one embodiment (no-flow process), the curable bonding compositions of the invention (having a fluxing agent) are positioned between an electronic component and a substrate by applying the bonding composition to either the surface of the electronic component or the substrate. The bonding composition may be in the form of a liquid or a film. Liquid curable bonding compositions for this process desirably have a viscosity in the range of about 1,000 to about 100,000 centipoise at 25° C. Films may be tacky or non-tacky and must have adequate thickness to fill the gap between the electronic component and the substrate. Films also should melt during the reflow cycle and become low enough in viscosity to allow the solder bumps to come in contact with the bonding pads. Liquid curable bonding compositions may be applied to the electronic component by needle dispensing, stencil printing, or screen printing and curable bonding compositions in film form may be first cut to size, and then simply laid onto the surface having the solder bumps or the surface having the corresponding electrical bonding pads. The liquid bonding composition is then dried by direct or indirect heating.

The substrate and the electronic component are then positioned so that the electrical bonding pads and the solder bumps are aligned. The assembly is then heated in a manner to cause solder reflow. Such heating typically utilizes a multi-zone oven having individual heat controls that provides a heating profile.

Test Methods

Glass Transition Temperature (Tg)

The glass transition temperature (Tg) of the cured unfilled resin compositions were determined using Differential Scanning Calorimetry (DSC) as follows. An uncured sample weighing between 4 milligrams and 8 milligrams was thermally scanned using a Model 2920 Modulated DSC (available from TA Instruments, New Castle, Del.) from about 35° C. to 275° C. at a rate of 10° C./minute under a nitrogen purge to obtain cure exotherm characteristics. The sample was then air cooled back down to about 30° C. A second heat was performed in the same manner to obtain the glass transition temperature (Tg) of the substantially cured resin sample. The Tg was taken as the midpoint of the glassy to rubbery transition part of the curve.

Coefficient of Thermal Expansion (CTE)

The coefficient of thermal expansion (CTE) was measured using a thermal mechanical analyzer (TMA), Model SS120C (available from Seiko Instruments Incorporated, Torrance, Calif., now known as Thermo Haake, Madison, Wis.) as follows. A cured, filled resin sample having a thickness of about 0.125 inches (0.32 cm) was evaluated using a circular quartz expansion probe with a load of 0.0098 Newtons. The sample was thermally scanned from 30 to 200° C. two times under a nitrogen purge. The CTE below the Tg (herein designated as (α1) was determined using the second scan. For Examples 2, 3, and Comparative Examples 1 and 3, the sample was prepared using a portion of the uncatalyzed, fluxing agent-containing composition to which was added the appropriate amount of catalyst. For Example 1, a second sample was prepared as described for Example 2.

Viscosity

The complex viscosity of the uncatalyzed, curable filled resin samples were measured using rheological dynamic analysis (RDA) as follows. A Rheometrics RDA-II Dynamic Mechanical Analyzer (commercially available from Rheometrics Inc., Piscataway, N.J.) was used in the parallel plate mode of operation to measure the complex viscosity of the curable resin compositions. Two to three grams of uncatalyzed curable resin composition were placed between the two parallel plates, each having a diameter of 25 millimeters. The resin was loaded at 25° C. (77° F.). The plates were then closed to provide a 1.0 millimeter gap filled with resin. Excess resin was scraped from the edges with a metal spatula. Viscosity was measured using a shear rate sweep from 15 to 0.01 Hz and a strain of 50 percent at a temperature of 25° C. (77° F.). The reported viscosity was that obtained at 1.0 Hz.

Level of Solids

The level of solids of the uncatalyzed (filled) master batch formulations was measured by thermogravimetric analysis using a thermogravimetric analyzer (Model Number 2950, available from TA Instruments, New Castle, Del.). The sample, weighing about 30 milligrams, was thermally scanned from 35° C. to 900° C. under an air purge of 60 cc/minute at a temperature scan rate of 20° C./minute.

Particle Size Determination

Particle size was determined using a Coulter® N4 Plus Submicron Particle Sizer with Size Distribution Processor Analysis and Multiple Scattering Angle Detection (available from Coulter Corporation, Miami, Fla.) which measures particle sizes of very dilute dispersions of particles by employing Photon Correlation Spectroscopy.

Measurements were made on aqueous dispersions by placing a drop of the concentrated dispersion in a disposable polystyrene sample holder designed for use in the Coulter® N4 Plus. The sample holder was then filled with about 4 ml of distilled water and shaken by hand to provide a uniform mixture. The holder with diluted sample was then placed into the Coulter® N4 Plus and evaluated to determine if the scattering intensity was in an acceptable range. Additional dilutions were made as needed to reach a concentration level that resulted in an acceptable scattering intensity for the measurement.

The sample was then allowed to equilibrate at 25° C. for 5 minutes before making a measurement. Measurements were made at a scattering angle of 90° using a unimodal analysis method and assigning values for water of 1.333 for the refractive index and 0.890 centipoise for the viscosity at 25° C. This method provided mean particle size distribution and standard deviation determination of the particles in water.

Particle size measurements for particles in solvents other than water was done by dispersing the sample in tetrahydrofuran (THF) in a quartz sample holder designed for the Coulter® N4 Plus and shaken by hand to provide a uniform dispersion.

The sample was diluted with additional solvent as needed to provide a concentration level that resulted in an acceptable scattering intensity for the measurement. Measurements were made as described above with the following modifications. The viscosity of THF at 25° C. was assumed to be 0.456 centipoise and the refractive index was assumed to be 1.407.

Electrical Connectivity

Circuit boards having silicon die attached thereon were evaluated for electrical connectivity by measuring the electrical resistance of the connection between the attached die and the circuit board bonding pads using a four-wire test and two daisy chain circuits. The four-wire testing employed a current source drive of 1.0 milliAmpere with an open circuit voltage of 10 Volts. If either of the two daisy chain circuits exhibited a resistance of greater than 1000 milliOhms, the board was deemed to have failed the test. A board which passed this test exhibited a daisy chain circuit resistance of from about 750 to about 900 milliOhms.

General Preparation of Circuit Boards with Attached Silicon Die

Silicon die (having the designation "PB10", available from Delphi Delco Electronics Systems, Kokomo, Ind.), each measuring 5 millimeter by 5 millimeter and having 64 peripheral pads with a 0.25 millimeter pitch were employed to prepare test circuit boards having integrated circuit chips thereon. The die (also referred to as "chips") were routed with two-pad jumper pairs and provided with eutectic tin-lead solder bumps having a diameter about 135 micrometers on the chip pads. These were attached to an FR-4 substrate measuring approximately 1×2.5×0.062 inches (2.54×6.35× 0.16 cm), and having 64 copper metallized bonding pads coated with electroless plated nickel/gold. The substrate was designed and routed to connect to the die using two interdigitated daisy chain loops. The interdigitated circuit was routed using two metal routing layers, with the interior area bounded by the substrate pads free of circuit lines. The daisy chain loops had circuit routing that allowed for four-wire test detection of minute changes in the loop resistance. One of these loops also had circuit routing that permitted nearly ideal four-wire testing of the individual pad jumper pairs. The board was covered with a solder mask except for the following areas: 1) a continuous channel that crossed all the bonding pads, thus leaving them exposed; 2) those vias connected to the second interdigitated daisy chain routing layer on the opposite side of the substrate; and 3) those vias (input/output pads) used to make electrical measurements using a pogo pin array test probe.

The test circuit boards were dried for 10 minutes at 210° C. in a furnace, then removed from the furnace and allowed to cool to room temperature (about 25° C.). Approximately 11 milligrams of the curable bonding composition was applied in one of three ways:

1) the curable resin was placed in the center of the area bounded by the pads at room temperature (about 25° C. (77° F.));

2) the curable resin was applied to the center of the bounded area on a board that had been preheated to 70° C. (this was the setting on the hot plate employed), and the temperature of the resin and the board was subsequently maintained at 70° C. for at least one minute; or 3) the curable resin was applied to the center of the bounded area on a board that had been preheated to 70° C. (on a hot plate) and a razor blade was drawn across the resin to spread it out and over the bonding pads after which additional curable resin sufficient to bring the total resin on the board to 11 milligrams was added; the resin and board were subsequently maintained at 70° C. for at least one minute.

The bumped silicon die were placed on the boards using a Toray Semi-Automatic COG Bonder (available from Toray Engineering Co. Ltd., Otsu-city, Shiga-ken, Japan) at room temperature using a pressure of 2 kg and a dwell time of 2 seconds. The boards with attached die were then passed through a Quad/QCR Zone Convection Reflow System (available from Quad Europe Limited, High Wycombe, Bucks, UK) and subjected to a eutectic tin/lead solder reflow profile. The reflow oven had four temperature zones (Zones 1-4) each having an approximate length of about 18 inches (46 cm) that were set to 170° C., 150° C., 150° C., and 250° C., respectively. A line speed of 15 inches/minute (38 cm/minute) was employed. This resulted in a dwell time of 2 minutes at 150° C. with a peak temperature of 225° C. The time above the melting temperature of Sn/Pb eutectic solder was approximately 75 seconds as measured using a thermocouple embedded in the adhesive. A test substrate having a chip bonded thereto was obtained and evaluated as described in "Electrical Connectivity" above.

Purification of Polyepoxide Resins

The polyepoxide resins used herein were purified to remove ionic impurities (e.g., chloride ions) and to make them substantially free of hydroxyl functionality. The procedure used was that described in U.S. Pat. Application Publication No. US 2002-0022709 A1 (Mader et al), discussed above.

EXAMPLES

Example 1

A blend of epoxy resin and silica particles having a diameter of approximately 123 nanometers was prepared and evaluated as follows. To a reaction flask equipped with an overhead stirrer, a condenser, and a thermometer and containing 100 grams of Nalco TX11005 (a potassium stabilized aqueous silica sol, having a solids level of about 30 percent by weight, a particle size of about 123 nanometers, a specific gravity of 1.21 at 25° C., a pH of 9.5 at 25° C., and a viscosity of 6.2 centipoise, obtained as an experimental product, Lot Number XE1H0202A1, available from Ondeo Nalco, Chicago, Ill.) were slowly added over a period of 5 minutes with stirring a mixture of 300 grams of 1-methoxy-2-propanol and 0.68 gram of phenyl trimethoxysilane (available from Aldrich Chemical Company, Milwaukee, Wis.). The mixture was then heated to 95° C. using a heating mantle and held there for 20 hours. The heating mantle was then removed and the contents of the flask were allowed to cool to room temperature with stirring, after which the contents were poured into aluminum trays and air dried for between 15 and 24 hours in a ventilated hood at room temperature to provide an essentially free flowing powder. A portion of the dried particles were stirred with deionized water for 3 hours and subsequently allowed to stand for 20 hours. The solids were filtered, washed with two portions of deionized water, and air dried for 24 hours in a ventilated hood at room temperature to provide a powder, containing some readily broken small agglomerates, of silica particles having a coating of silane coupling agent thereon and whose starting diameter was approximately 123 nanometers.

Acetone, 258 parts by weight (pbw), was mixed with 64.5 pbw of the dried silica particles. To this mixture was added 23.8 pbw of EPON® 862 (a diglycidyl ether of Bisphenol F, available from Resolution Performance Productions, Houston, Tex.) and 11.7 pbw MY 0510 (a triglycidyl ether of para-aminophenol, available from Vantico, Brewster, N.Y.). This blend was mixed at room temperature using a high speed shear mixer (Silverson Laboratory Mixer Model L4R, available from Silverson Machines, East Longmeadow, Mass.) for about 5 minutes, then allowed to stand for at least 3 hours at room temperature followed by filtration through a 1 micrometer glass syringe filter (Acrodisc® 25 millimeter syringe filter with a 1 micrometer glass fiber membrane, PN 4523T, available from Gelman Laboratory, Ann Arbor, Mich.) to provide a dispersion of silica particles in a solution of acetone and epoxy resins. The dispersion was concentrated for 45 minutes at 125° C. using a rotary evaporator, using first an aspirator vacuum then a vacuum pump. The resulting composition of this uncatalyzed master batch dispersion was analyzed by thermal gravimetric analysis (TGA), and the particle loading level was determined to be 64.5 percent by weight.

To 15 grams of this master batch dispersion was added 0.97 gram of EPON® 862, 0.48 gram of MY 0510, and 2.9 grams of N,N'-bis(salicylidene)-1,2-propanediamine (referred to in the tables below as N,N'-BS-1,2-PD) (available from TCI America, Portland, Oreg.), and the resulting composition was mixed with a Speed Mixer™ DAC 150 FV (available from Flack Tek Inc., Landrum, S.C.) for 5 minutes at 3000 rpm to provide an uncatalyzed, fluxing agent-containing composition. To 2.0 grams of this composition was added 0.06 gram of a catalyst mixture containing equal portions (by weight) of EPON® 862, EPON® 828 (a diglycidyl ether of Bisphenol A, available from Resolution Performance Productions, Houston, Tex.), and 4,5-diphenylimidazole (referred to in the tables below as 4,5-DPI). This composition was mixed using the Speed Mixer™ for 2 minutes at 3400 rpm to provide the final curable bonding composition.

The following characteristics were determined as described in the test methods above: viscosity (before adding catalyst), glass transition temperature, coefficient of thermal expansion, and utility as an underfill adhesive to attach silicon die to circuit boards. When evaluated as an underfill material, the curable bonding composition was applied using each of the three methods described in "General Preparation of Circuit Boards with Attached Silicon Die" above as follows: two samples using method 1; four samples using method 2; and two samples using method 3.

Example 2

Example 1 was repeated with the following modifications. The Nalco TX11005 was treated with acidic ion exchange resin (Amberlite® IR-120 plus Ion Exchange Resin, a strongly acidic gel-type resin with sulfonic acid functionality, available as Catalog No. 21,653-4 from Aldrich Chemical Company, Milwaukee, Wis.) (prior to use, the ion exchange resin was soaked in a large excess of water for about 30 minutes then filtered through a 10 micrometer nylon fabric mesh; this was done three times) to provide a pH of between about 2 and about 3 (as measured using pH paper). This was stirred at room temperature for between about 30 minutes and about 45 minutes, followed by filtration through a 10 micrometer nylon fabric mesh. The filtrate sol was treated with aqueous ammonium hydroxide to bring the pH to between about 8 and about 9 (as measured using pH paper). This material was then provided with a silane surface treatment and used to prepare an uncatalyzed fluxing agent-containing composition as described in Example 1. To 6.1 grams of the uncatalyzed fluxing agent-containing composition was added 0.71 gram of EPON® 862, 0.37 gram of MY 0510, 0.45 gram of N,N'-bis(salicylidene)-1,2-propanediamine (referred to in the tables below as N,N'-BS-1, 2-PD), and 0.27 gram of the catalyst mixture described in Example 1 to provide the final curable bonding composition.

The following characteristics were determined as described in the test methods above: coefficient of thermal expansion, and utility as an underfill adhesive to attach silicon die to circuit boards. When evaluated as an underfill material, the curable bonding composition was applied for four samples using method 1 described in "General Preparation of Circuit Boards with Attached Silicon Die".

Example 3

A blend containing epoxy resin and two different size silica particles, having approximate particle diameters of 20 nanometers and 123 nanometers, respectively, was prepared and evaluated as follows. An uncatalyzed master batch preparation containing silica nanoparticles in an epoxy resin was provided by first preparing two separate master batch precursor compositions, one containing the smaller particles and one containing the larger particles using the procedure described in Example 1. The master batch precursor composition having the smaller particles was made using the following amounts: 700 grams of Nalco 2327 (an ammonium stabilized aqueous silica sol, having a solids level of about 40 percent by weight and a particle size of 20 nanometers, a surface area of 150 m$^2$/g, a specific gravity of 1.29, a pH at 25° C. of 9.3, and a viscosity of 20 Centipoise, available from Ondeo Nalco, Chicago, Ill.), 1200 grams of 1-methoxy-2-propanol, and 37 grams of phenyltrimethoxysilane were used to provide silica particles having a coating of silane coupling agent thereon and whose starting diameter was 20 nanometers. To 30 pbw of the treated small particles in 60 pbw acetone was added 13.4 pbw EPON® 862, 6.6 pbw of MY 0510 with mixing to provide a dispersion of treated small particles in an acetone solution of epoxy resin. This dispersion was filtered to provide the master batch precursor containing silica particles having a starting diameter of approximately 20 nanometers. The master batch precursor composition containing silica particles having a starting diameter of approximately 123 nanometers was prepared in a similar manner using 0.11 millimoles of silane coupling agent to 1.0 gram of solid silica. The two filtered precursor compositions were then combined in a 1:1 (w/w) ratio and concentrated down uncatalyzed master batch containing two different size silica particles whose starting sizes were approximately 20 nanometers and 123 nanometers, respectively. The particle loading level of the combined master batch was determined by TGA to be 60.1 percent by weight.

To 20 grams of this combined master batch blend was added 3.4 grams of N,N'-bis(salicylidene)-1,2-propanediamine using a Speed Mixer™ DAC 150 FV as described in Example 1 to provide an uncatalyzed, fluxing agent-containing composition. Finally, to 1.9 grams of this composition was added 0.06 gram of the catalyst mixture described in Example 1 to provide the final curable bonding composition.

The following characteristics were determined as described in the test methods above: viscosity (before adding catalyst), glass transition temperature, coefficient of thermal expansion, and utility as an underfill adhesive to attach silicon die to circuit boards. When evaluated as an underfill material, the curable bonding composition was applied using each of the three methods described in "General Preparation of Circuit Boards with Attached Silicon Die" above as follows: two samples using method 1; two samples using method 2; and four samples using method 3.

Example 4

A blend of epoxy resin and silica particles having a diameter of 300 nanometers was prepared and evaluated as follows. To a reaction flask equipped with an overhead stirrer, a condenser, and a thermometer were added 200 grams of an aqueous sol designated "5296964" (an aqueous suspension of 300 nanometers silica particles, having a solids level of about 21.8 percent solids by weight, obtained from Catalysts and Chemicals Industries Company, Ltd., Tokyo, Japan) and 350 grams of 1-methoxy-2-propanol. Such particles may be prepared using the procedure described in Stober et al., *Journal of Colloid and Interface Science*, vol. 26, pp. 62-69 (1968). The contents of the flask were heated with a heating mantle to 90° C. with rapid stirring. Ammonium hydroxide was added until the pH of the mixture was 9.5, and stirring was continued for one hour at 90° C. Next, 0.87 gram of phenyltrimethoxysilane was added, and the reaction was heated at 90° C. for 24 hours with stirring as above. The heating mantle was then removed and the contents of the flask were allowed to cool to room temperature with stirring, after which the contents were poured into aluminum trays and air dried for 24 hours in a ventilated hood at room temperature to provide an essentially free flowing powder. A portion of the dried particles were stirred with deionized water for 3 hours and subsequently allowed to stand for 20 hours. The solids were filtered, washed with two portions of deionized water, and air dried for 24 hours in a ventilated hood at room temperature to provide a powder, containing some readily broken small agglomerates, of silica particles having a coating of silane coupling agent thereon and whose starting diameter was approximately 300 nanometers.

An uncatalyzed master batch preparation containing silica particles in an epoxy resin blend was prepared using the procedure described in Example 1 with the following modifications. To 15 grams of the dried 300 nanometers particles in 150 grams of acetone were added 10 grams of a blend of epoxy resins, EPON® 862:EPON® 828/1:1 (w:w) with high shear speed mixing. The resulting mixture was concentrated down on a rotary evaporator for 30 minutes at 150° C., using first an aspirator vacuum then a vacuum pump, to provide an uncatalyzed master batch having a calculated particle loading level of 60.0 percent solids by weight.

An uncatalyzed, fluxing agent-containing composition was prepared using this master batch as described in Example 1 with the following modifications: 5.1 grams of the master batch and 0.94 gram of N,N'-bis(salicylidene)-1, 2-propanediamine were employed. Finally, to 2.1 grams of this uncatalyzed fluxing agent-containing composition was added 0.07 gram of the catalyst mixture described in Example 1 to provide the final curable bonding composition.

The following characteristics were determined as described in the test methods above: viscosity (before adding catalyst), glass transition temperature and utility as an underfill adhesive to attach silicon die to circuit boards. When evaluated as an underfill material, the curable bonding composition was applied for eight samples using method 1 as described in "General Preparation of Circuit Boards with Attached Silicon Die" above.

Example 5

A blend of epoxy resin and silica particles having a diameter of approximately 550 nanometers was prepared and evaluated as described in Example 4 with the following modifications. An aqueous sol designated "5296965" (an aqueous suspension of 550 nanometers silica particles, 20.6 percent solids by weight, obtained from Catalysts and Chemicals Industries Company, Ltd., Tokyo, Japan) and 0.82 gram of phenyltrimethoxysilane were employed. Such particles may be prepared using the procedure described in Stober et al., *Journal of Colloid and Interface Science*, vol. 26, pp. 62-69 (1968). After preparation, the silica particle/epoxy resin blend was further mixed using a paint mill to ensure a uniform dispersion. The uncatalyzed master batch had a calculated particle loading level of 60.0 percent by weight. An uncatalyzed, fluxing agent-containing composition was prepared using 0.89 gram of N,N'-bis(salicylidene)-1,2-propanediamine. The final curable bonding composition was prepared using 0.06 gram of the catalyst mixture described in Example 1.

The following characteristics were determined as described in the test methods above: viscosity (before adding catalyst) and utility as an underfill adhesive to attach silicon die to circuit boards. When evaluated as an underfill material, the curable bonding composition was applied for eight samples using method 1 described in "General Preparation of Circuit Boards with Attached Silicon Die" above.

Example 6

A blend containing epoxy resin and two different size silica particles, having particle diameters of approximately 20 nanometers and 4500 nanometers, respectively, was prepared and evaluated as follows. First, 300 grams of SILSTAR LE-05S (a spherical silica filler with an average particle diameter of 4.5 micrometer (4500 nanometers), available from JCI USA, Inc., White Plains, N.Y.), 300 grams of ethanol, and 300 grams of water were added to a reaction flask equipped with an overhead stirrer, a condenser, and a thermometer. The mixture was stirred and heated to 60° C., and ammonium hydroxide was added with continued stirring after reaching 60° C. until the pH was between nine and ten. Stirring at 60° C. was continued for one hour. Next, while maintaining the temperature between 60-65° C. and stirring, 5.95 grams of phenyltrimethoxysilane was added. Then, after stirring at 60-65° C. for an additional 24 hours, the mixture was filtered and the recovered silica particles were washed with 400 grams of water followed by 400 grams of ethanol and dried overnight at ambient conditions and subsequently at 100° C. for four hours. The dried particles were sieved through a 300 micrometers metal screen to provide a powder of silica particles having a coating of silane coupling agent thereon and whose starting average diameter was approximately 4500 nanometers.

An uncatalyzed master batch preparation containing silica particles in an epoxy resin blend was prepared using the procedure described in Example 1 with the following modification. The smaller (20 nanometers) silane coupling agent-coated silica particles employed were prepared as described in Example 3. These smaller silica particles were combined with epoxy resin, filtered, and concentrated down to provide a master batch precursor composition batch having a particle loading level of 42.5 percent solids by weight as measured by TGA.

To 18.1 grams of this uncatalyzed composition was added 7.7 grams of the 7500 nanometers silane coupling agent-coated silica particles prepared previously and 4.5 grams of N,N'-bis(salicylidene)-1,2-propanediamine. The resulting composition was mixed with a Speed Mixer™ DAC 150 FV as described in Example 1 to provide an uncatalyzed, fluxing agent-containing composition. The final catalyzed, fluxing agent-containing composition was prepared by combining 2.2 grams of the uncatalyzed, fluxing agent-containing composition and 0.06 gram of the catalyst mixture as described in Example 1. This final curable bonding composition had a calculated particle loading level of 50.0 percent solids by weight, with equal amounts of the smaller and larger silica particles.

The following characteristics were determined as described in the test methods above: viscosity (before adding catalyst) and utility as an underfill adhesive to attach silicon die to circuit boards. When evaluated as an underfill material, the curable bonding composition was applied for four samples using method 1 described in "General Preparation of Circuit Boards with Attached Silicon Die" above.

Example 7

A blend containing epoxy resin and two different size silica particles (having an approximate particle size 20 nanometers and 2000 nanometers, respectively) was prepared and evaluated as follows. Example 6 was repeated with the following modifications. The 4500 nanometers silica particles were replaced with silane coupling agent-coated silica particles prepared using 100 grams each of SILSTAR LE-02S (a spherical silica filler having a particle diameter of 2.0 micrometer (2000 nanometers) (D50, MicroTrac) having a maximum particle size of less than 10 micrometer, available from JCI USA, Inc., White Plains, N.Y.), water and ethanol along with 1.5 grams of phenyltrimethoxysilane. After addition of the silane coupling agent, the mixture was stirred for 16 hours at 60° C. Following washing with water and ethanol, the treated silica particles were dried in a vacuum oven for 3 hours at 100° C. to provide silica particles having a coating of silane coupling agent thereon and whose starting average diameter was 2000 nanometers. The treated particles were not sieved.

To 17.7 grams of the uncatalyzed composition containing the smaller particles was added 7.5 grams of the 2000 nanometers silane coupling agent-coated silica particles prepared previously and 4.4 grams of N,N'-bis(salicylidene)-1,2-propanediamine to provide an uncatalyzed, fluxing agent-containing composition. The final catalyzed, fluxing agent-containing composition was prepared by combining 2.1 grams of the uncatalyzed, fluxing agent-containing composition and 0.06 gram of the catalyst mixture as described in Example 1. This final curable bonding composition had a calculated particle loading level of 50.0 percent solids by weight, with equal amounts of the smaller and larger silica particles.

The following characteristics were determined as described in the test methods above: viscosity (before adding catalyst) and utility as an underfill adhesive to attach silicon die to circuit boards. When evaluated as an underfill material, the curable bonding composition was applied for four samples using method 1 described in "General Preparation of Circuit Boards with Attached Silicon Die" above.

Example 8

Example 1 was repeated with the following modifications. To 700 grams of Nalco, TX11005 was added 3.0 grams of Amberlite IR-120 plus Ion Exchange Resin, and the mixture was stirred for 30 minutes at room temperature. The ion exchange resin was then removed using a cloth having a mesh size of 10 micrometers. The solution was placed back into the reaction flask, and aqueous ammonium hydroxide was added by dropwise addition until the dispersion exhibited a pH=9 as measured with pH paper. A premixed solution of 1400 grams of 1-Methoxy-2-propanol and 4.8 grams of phenyl trimethoxysilane was slowly added over a period of about 5 minutes with stirring, and the resulting mixture was stirred for 24 hours at 90° C. A portion of the resulting dispersion was dried at room temperature overnight. A powder, containing some readily broken small agglomerates, of silica particles having a coating of silane coupling agent thereon and whose starting diameter was approximately 123 nanometers was obtained. Acetone, 750 grams, was mixed with 250 grams of the dried silica particles. This dispersion was mixed at room temperature using a high speed shear mixer for about 5 minutes, then allowed to stand for 2 hours at room temperature followed by filtration through a 1 micrometer glass syringe filter to provide a 24 percent solids dispersion of silica particles in acetone (as measured by evaporation in a heated oven). To 480 grams of this dispersion was added 15.0 grams of EPON® 862 and 16.1 grams of 4-hexahydromethylphthalic anhydride. The dispersion was concentrated for 40 minutes at 125° C. using a rotary evaporator, equipped with a vacuum pump. The composition of this uncatalyzed master batch dispersion was analyzed by thermal TGA, and the particle loading level was determined to be 64.3 percent by weight. To 44.6 grams of this uncatalyzed master batch dispersion was added 4.0 grams of EPON® 828, 2.2 grams of 4-hexahydromethylphthalic anhydride, 1.64 grams of 2,2-bis(hydroxymethyl)-n-butyric acid, and 0.23 grams of tetrabutylphosphonium tetraphenyl borate. The resulting mixture was mixed with a SpeedMixer™ for 5 minutes at 3400 rpm to provide the final curable bonding composition.

The following characteristics were determined as described in the test methods above: viscosity, glass transition temperature, and utility as an underfill adhesive to attach silicon die to circuit boards. When evaluated as an underfill material, the curable bonding composition was applied using method 1 described in "General Preparation of Circuit Boards with Attached Silicon Die".

Comparative Example 1

A blend of polyepoxide resin and silica particles having an average diameter of 4500 nanometers was prepared and evaluated as follows. To a Speed Mix™ cup (available from Flack Tek Inc., Landrum, S.C.) were added 4.7 grams of EPON® 862, 2.3 grams of MY 0510, and 3.0 grams of N,N'-bis(salicylidene)-1,2-propanediamine, 10 grams of Silstar LE-05S (treated as described in Example 6) and 0.4 gram of CAB-OSIL® TS-720 (treated fumed silica (hydrophobic), available from Cabot Corporation, Tuscola, Ill.). This mixture was stirred using a Speed Mixer™ for 5 minutes at 3000 rpm to provide an uncatalyzed, fluxing agent-containing composition. The final curable bonding composition was prepared by combining 2.2 grams of uncatalyzed, fluxing agent-containing composition and 0.07 gram of the catalyst mixture as described in Example 1.

The following characteristics were determined as described in the test methods above: viscosity (before adding catalyst), glass transition temperature, coefficient of thermal expansion, and utility as an underfill adhesive to attach silicon die to circuit boards. When evaluated as an underfill material, the curable bonding composition was applied using two of the three methods described in "General Preparation of Circuit Boards with Attached Silicon Die" above as follows: eight samples using method 1; and four samples using method 2.

Comparative Example 2

A blend of polyepoxide resin and silica particles having a particle diameter of 2000 nanometers was prepared and evaluated as described in Comparative Example 1 with the following modifications. Treated Silstar LE-02S as prepared in Example 7 was used in place of Silstar LE-05S. The final curable bonding composition was prepared by combining 2.4 grams of the uncatalyzed, fluxing agent-containing composition and 0.07 gram of the catalyst mixture as described in Example 1.

The following characteristics were determined as described in the test methods above: viscosity (before adding catalyst) and utility as an underfill adhesive to attach silicon die to circuit boards. When evaluated as an underfill material, the curable bonding composition was applied using two of the three methods described in "General Preparation of Circuit Boards with Attached Silicon Die" above as follows: six samples using method 1; and two samples using method 2.

Comparative Example 3

A polyepoxide resin blend containing fluxing agent and curing catalyst, but no nanometer-sized silica particles of the invention, was prepared as described in Comparative Example 1 with the following modifications. The components and amounts used were: 15 grams of EPON® 862, 7.5 grams of MY 0510, 9.6 grams of N,N'-bis(salicylidene)-1,2-propanediamine (9.6 g), and 0.66 gram of TS-720. The final curable bonding composition was prepared by combining 1.8 grams of the uncatalyzed, fluxing agent-containing composition and 0.11 gram of the catalyst mixture as described in Example 1.

The following characteristics were determined as described in the test methods above: viscosity (before adding catalyst), glass transition temperature, coefficient of thermal expansion, and utility as an underfill adhesive to attach silicon die to circuit boards. When evaluated as an underfill material, the curable bonding composition was applied using two of the three methods described in "General Preparation of Circuit Boards with Attached Silicon Die" above as follows: three samples using method 1; and two samples using method 2.

TABLE 1

| Example | Epoxy A (pbw) | Epoxy B (pbw) | N,N-BS-1,2-PD (pbw) | Particle A (diameter, nm) (pbw) (Vol. %) | Particle B (diameter, nm) (pbw) (Vol. %) | TS-720 (pbw) | 4,5-DPI* |
|---|---|---|---|---|---|---|---|
| 1 | EPON® 862 23 | MY 0510 11 | 15 | 123 (49) (32.0) | — | — | 1 |
| 2 | EPON® 862 28 | MY 0510 14 | 17 | 123 (38.5) (23.8) | — | — | 1 |
| 3 | EPON® 862 23 | MY 0510 11 | 15 | 123 (25) (16.7) | 20 (25) (16.7) | — | 1 |
| 4 | EPON® 862 18 | EPON® 828 18 | 15 | 300 (48) (31.6) | — | — | 1 |
| 5 | EPON® 862 17 | EPON® 828 17 | 15 | 550 (49) (32.0) | — | — | 1 |
| 6 | EPON® 862 23 | MY 0510 11 | 14 | 20 (25) (16.7) | 4500 (25) (16.7) | — | 1 |
| 7 | EPON® 862 23 | MY 0510 11 | 14 | 20 (25) (16.7) | 2000 (25) (16.7) | — | 1 |
| 8 | EPON® 862 15 | EPON® 828 7.7 | — | 123 (55) (38) | — | — | — |
| CE 1 | EPON® 862 23 | MY 0510 11 | 14 | 4500 (48) (31.6) | — | 2 | 1 |
| CE 2 | EPON® 862 23 | MY 0510 11 | 14 | 2000 (48) (31.6) | — | 2 | 1 |
| CE 3 | EPON® 862 45 | MY 0510 22 | 28 | — | — | 2 | 2 |

CE = Comparative Example
*= As part of the 4,5-DPI catalyst mixture, Examples 1, 2, 3, 6, 7, CE 1 and CE 2 also contain 1 pbw EPON® 828; CE 3 also contains 2 pbw EPON® 828.
**= Example 8 contains 20 pbw 4-hexahydromethylphthalic anhydride, 3 pbw 2,2-bis(hydroxymethyl)-n-butyric acid. Instead of 4,5-DPI, 0.4 pbw of tetrabutylphosphonium tetraphenyl borate was used as the catalyst.

TABLE 2

| Example | Viscosity (poise) (Pa-sec.) | Tg (° C.) | CTE (α1) (ppm/° C.) | Electrical Connectivity |
|---|---|---|---|---|
| 1 | 89 (8.9) | 116 | 42* | 8/8 (100%) |
| 2 | N.D. | N.D. | 45 | 4/4 (100%) |
| 3 | 235 (23.5) | 111 | 37 | 8/8 (100%) |
| 4 | 133 (13.3) | 104 | N.D. | 8/8 (100%) |
| 5 | 152 (15.2) | N.D. | N.D. | 7/8 (88%) |
| 6 | 182 (18.2) | N.D. | N.D. | 4/4 (100%) |
| 7 | 135 (13.5) | N.D. | N.D. | 3/4 (75%) |
| 8 | 83 (8.3) | 94 | N.D. | 4/4 (100%) |
| CE 1 | 130 (13.0) | 117 | 38 | 4/12 (33%) |
| CE 2 | 58 (5.8) | N.D. | N.D. | 0/8 (0%) |
| CE 3 | 86 (8.6) | 120 | 64 | 5/5 (100%) |

CE = Comparative Example
*= obtained on third thermal scan
N.D. = not determined Example 9

Example 1 was repeated with the following modifications. To 450 grams of Nalco, TX11005 was slowly added over a period of about 5 minutes with stirring a mixture of 700 grams of 1-Methoxy-2-propanol and 3.07 grams of phenyl trimethoxysilane. A portion of the dried particles was stirred with deionized water for 2 hours and subsequently allowed to stand for 20 hours. A powder, containing some readily broken small agglomerates, of silica particles having a coating of silane coupling agent thereon and whose starting diameter was approximately 123 nanometers was obtained.

Acetone, 150 pbw, was mixed with 38.4 pbw of the dried silica particles. This dispersion was mixed at room temperature using a high speed shear mixer for about 5 minutes, then allowed to stand for at least 4 hours at room temperature followed by filtration through a 1 micrometer glass syringe filter to provide an 18.1 percent solids dispersion of silica particles in acetone (as measured by evaporation in a heated oven). To 155 grams of this dispersion was added 15.0 grams of EPON® 862 and 13.4 grams of 4-hexahydromethylphthalic anhydride with gentle mixing. The dispersion was concentrated for 20 minutes at 125° C. using a rotary evaporator, using first an aspirator vacuum then a vacuum pump. To 51 grams of this uncatalyzed master batch dispersion was added 0.26 gram of 1-(2-cyanoethyl)-2-ethyl-4-methyl imidazole (available under the designation "Curezol 2E4MZ-CN" from Shikoku Corporation Kagawa, Japan), and the resulting composition was mixed with a Speed Mixer™ for 3 minutes to provide the final curable bonding composition. The viscosity of this material was measured as described in the "Viscosity" test method above and found to be 39.0 poise (3.9 Pa-sec.). This final curable composition was evaluated as a capillary underfill as follows.

A test board having a solder bumped flip chip bonded thereto was provided. About 14 milligrams of the final curable composition was easily dispensed partly around the periphery of the flip chip and was observed to readily wick between the board substrate and flip chip and completely fill this area. This was cured at 150° C. for forty minutes. These results indicate that the final curable compositions of the present invention can be applied using a capillary process.

Examples 10A and 10B

The particle size of nanoparticles in an aqueous sol was measured both before and after being provided with a silane surface treatment and mixing into a polyepoxide resin. More specifically, a sample of the aqueous sol Nalco TX11005 was evaluated for particle size as described in "Particle Size Determination" (this is designated as Example 10A), then provided with a silane surface treatment as described in Example 1. To 266 pbw of the resulting 1-methoxy-2-propanol mixture containing 7.5 percent (w/w) of treated nanoparticles was added 20 pbw of EPON® 828. Next, the water and solvent were removed using a rotary evaporator and vacuum pump for one hour while increasing the temperature to 125° C. over this time to provide uniform, nonagglomerated dispersion of polyepoxide resin having surface treated nanoparticles therein. This resin was evaluated for particle size as described in "Particle Size Determination" (this is designated as Example 10B). The results are shown in Table 3.

Comparative Example 4

Example 10B was repeated with the following modifications. To 200 pbw of 1-methoxy-2-propanol was added 66.6 pbw of the aqueous sol Nalco TX11005 resulting in a homogenous dispersion of untreated nanoparticles. To this dispersion was added 20 pbw of EPON® 828. When an attempt was made to concentrate this blend down, a rigid gel formed after removal of about half the water and solvent.

Examples 11A and 11B

In a manner similar to that described for Examples 10A and 10B, particle size determinations were made on the aqueous sol Nalco 2329 (a sodium stabilized aqueous silica sol, having a solids content of 40 percent by weight and a particle size of 75 nanometers, a surface area of 40 g/m², a specific gravity of 1.29 at 25° C., a pH of 8.4 at 25° C., and a viscosity of 10 centipoise, available from Ondeo Nalco, Chicago, Ill. (this is designated as Example 11A) and on a uniform, nonagglomerated dispersion of polyepoxide resin containing these particles after they were provided with a silane surface treatment (this is designated as Example 11B). The results are shown in Table 3.

Comparative Example 5

Example 11B was repeated in a manner similar to that described for Comparative Example 4 wherein untreated nanoparticles were employed and, like Comparative Example 4, a rigid gel formed while the blend was being concentrated down.

Examples 12A and 12B

In a manner similar to that described for Examples 10A and 10B, particle size determinations were made on the aqueous sol designated "5296965" (this is designated as Example 12A) and on a uniform, nonagglomerated dispersion of polyepoxide resin containing these particles after they were provided with a silane surface treatment (this is designated as Example 12B). The results are shown in Table 3.

Comparative Example 6

Example 12B was repeated in a manner similar to that described for Comparative Example 4 wherein untreated nanoparticles were employed. This resulted in a grainy dispersion of agglomerated particles in polyepoxide resin after concentration of the blend.

Example 13

In a manner similar to that described for Examples 10A, particle size determination was made on the aqueous sol designated "5296964" (this is designated as Example 13). The results are shown in Table 3.

TABLE 3

| Example | Mean Particle Size (nm) | Standard Deviation (nm) |
| --- | --- | --- |
| 10A | 118 | 22.5 |
| 10B | 111 | 20.3 |
| CE 4 | Gelled | — |
| 11A | 97 | 17 |
| 11B | 92.9 | 32 |
| CE 5 | Gelled | — |
| 12A | 421 | 59 |
| 12B | 536 | 75 |
| CE 6 | Agglomerated | — |
| 13 | 300 | 37 |

CE = Comparative Example

What is claimed is:
1. An electronic assembly comprising:
an electronic component electrically bonded to a substrate with an underfill adhesive between the electronic component and substrate, wherein the underfill adhesive comprises the reaction product of a curable underfill bonding composition, said curable underfill bonding composition having a viscosity of from 1,000 to about

100,000 centipoise at 25° C. and comprising a mixture of polyepoxide resin and surface-treated nanoparticles comprising silica that are substantially spherical, non-agglomerated, amorphous, and solid.

2. The electronic assembly of claim 1 wherein the surface treated nanoparticles have a mean particle size of from about 5 to about 600 nanometers.

3. The electronic assembly of claim 1 wherein the surface treated nanoparticles are present in the underfill adhesive in an amount of from about 30 to about 70 weight percent.

4. The electronic assembly of claim 1 wherein the CTE of the underfill adhesive ranges from about 20 to about 50 ppm/° C.

5. The electronic assembly of claim 1 wherein the polyepoxide is present in the underfill adhesive in an amount of from 10 to 70 parts per 100 parts of the total composition.

6. The electronic assembly of claim 1 wherein the surface treated nanoparticles are present in the underfill adhesive in an amount of from about 35 to about 65 weight percent.

7. The electronic assembly of claim 1 wherein the polyepoxide is substantially free of hydroxyl functionality.

8. The electronic assembly of claim 1 wherein the surface treated nanoparticles have a mean particle size of from about 10 to about 300 nanometers.

9. The electronic assembly of claim 1 wherein the surface treated nanoparticles have a mean particle size of from about 20 to about 150 nanometers.

10. The electronic assembly of claim 1 wherein the surface treated nanoparticles have a mean particle size of from about 20 to about 125 nanometers.

11. The electronic assembly of claim 1 wherein the surface treated nanoparticles have a mean particle size of from about 100 to about 500 nanometers.

12. The electronic assembly of claim 1 wherein the curable underfill bonding composition further comprises a fluxing agent, the fluxing agent is selected from the group consisting of carboxylic acids, acid anhydrides, chelating agents, and combinations thereof.

13. The electronic assembly of claim 1 wherein the polyepoxide is a mixture of diglycidyl ether of Bisphenol F and triglycidyl ether of para-aminophenol.

14. The electronic assembly of claim 1 wherein the surface treated nanoparticles comprises a blend of two or more surface treated nanoparticles, each having a mean particle size of from about 10 to about 150 nanometers.

15. The electronic assembly of claim 1 further comprising filler particles having an average particle diameter of greater than 1 micrometer.

16. The electronic assembly of claim 1 wherein the electronic component is selected from the group consisting of integrated circuit chips, resistors, capacitors, packages, and combinations thereof.

17. The electronic assembly of claim 1 wherein the substrate is a printed circuit board or a flexible circuit.

* * * * *